(12) United States Patent
Veenstra et al.

(10) Patent No.: US 6,525,678 B1
(45) Date of Patent: Feb. 25, 2003

(54) CONFIGURING A PROGRAMMABLE LOGIC DEVICE

(75) Inventors: Kerry S. Veenstra, San Jose, CA (US); Boon Jin Ang, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/972,674

(22) Filed: Oct. 5, 2001

Related U.S. Application Data
(60) Provisional application No. 60/238,491, filed on Oct. 6, 2000.

(51) Int. Cl.[7] .............................. H03M 5/00; G06F 7/38; H03K 19/177
(52) U.S. Cl. .......................................... 341/55; 326/40
(58) Field of Search ............................. 326/38, 39, 40; 341/55, 59, 63; 709/217; 713/187, 193

(56) References Cited

U.S. PATENT DOCUMENTS

| | | | | |
|---|---|---|---|---|
| 5,563,592 A | * | 10/1996 | Cliff et al. ..................... | 341/63 |
| 5,768,372 A | * | 6/1998 | Sung et al. .................. | 713/193 |
| 5,872,529 A | * | 2/1999 | Mejia ........................... | 341/59 |

OTHER PUBLICATIONS

Ch. W. Bachman, "The Programmer as Navigator", ACM Tutoring, vol. 16, No. 11, Nov. 1973, pp. 653–658.

Ch. W. Bachman, "Implementation Techniques for Data Structure Sets", North–Holland Publishing Co 1974, pp. 147–279.

Ch. W. Bachman papers, 1951–1996, CBI 125, 35 pgs., www.cbi.umn.edu/inv/bachman.htm, downloaded Mar. 27, 2000.

M. Jakobsson, "On Compression Techniques for Indexed Files", University of VAASA, Report A30, 1981, pp. 28–35.

M. Jakobsson, "Evaluation of a Hierarchical BIT–Vector Compression Technique", Information Processing Letters, vol. 14, No. 4, pp. 147–149.

D. King, "The Binary Vector as the Basis of an Inverted Index File", J. of Library Automation, vol. 7/4, Dec. 1974, pp. 307–314.

R. N. Williams, "Adaptive Data Compression", Kluwer Academic Publishers, 1991, pp. 19–22.

IEEE Transactions on Information Theory, correspondence, Nov. 1965, pp. 399–401.

* cited by examiner

*Primary Examiner*—Patrick Wamsley
(74) *Attorney, Agent, or Firm*—Morrison & Foerster LLP (57) ABSTRACT

A programmable logic device (PLD) can be configured using configuration data stored on a memory. The configuration data is compressed using a compression algorithm before being stored on the memory. When the PLD is to be configured, the compressed configuration data is read from the memory, decompressed, then loaded onto the PLD.

19 Claims, 8 Drawing Sheets

CONFIGURING A PROGRAMMABLE LOGIC DEVICE

CROSS REFERENCE TO RELATED APPLICATIONS

The present application claims the benefit of earlier filed provisional application U.S. Ser. No. 60/238,491, entitled DECOMPRESSION ON A CONFIGURABLE DEVICE, filed on Oct. 6, 2000, the entire content of which is incorporated herein by reference.

BACKGROUND

1. Field of the Invention

The present invention generally relates to programmable logic devices (PLDs) and more particularly to a system and method of configuring PLDs.

2. Description of the Related Art

In general, a programmable logic device (PLD) is configured by loading configuration data onto the PLD. The configuration data is typically cleared from the PLD when the PLD is powered down. As such, the configuration data is typically stored in memory, and the PLD is configured each time the PLD is powered up.

The time required to configure a PLD can be limited either by the time required to read the configuration data from memory or by the time required to write the configuration data into the PLD, which ever takes longer. Additionally, as the complexity of PLDs increases, so does the size of the configuration data that is used to configure the PLDs.

The amount of time required to configure a PLD can be reduced by increasing the access rate of the memory used to store the configuration data. However, there is generally a correlation between the speed and the price of memory (i.e., a faster memory is typically more expensive than a slower one). Thus, reducing the amount of time to configure a PLD by using faster memory can increase the price of the system that contains the PLD.

SUMMARY

The present invention relates to a system and method of configuring programmable logic devices (PLDs). In accordance with one aspect of the present invention, the configuration data used to configure a PLD is compressed using a compression algorithm before being stored in memory. When the PLD is to be configured, the compressed configuration data is read from memory, decompressed, then loaded onto the PLD.

DESCRIPTION OF THE DRAWING FIGURES

The present invention can be best understood by reference to the following description taken in conjunction with the accompanying drawing figures, in which like parts may be referred to by like numerals.

DETAILED DESCRIPTION

In order to provide a more thorough understanding of the present invention, the following description sets forth numerous specific details, such as specific configurations, parameters, and the like. It should be recognized, however, that such description is not intended as a limitation on the scope of the present invention, but is intended to provide a better description of exemplary embodiments.

Figure 1:
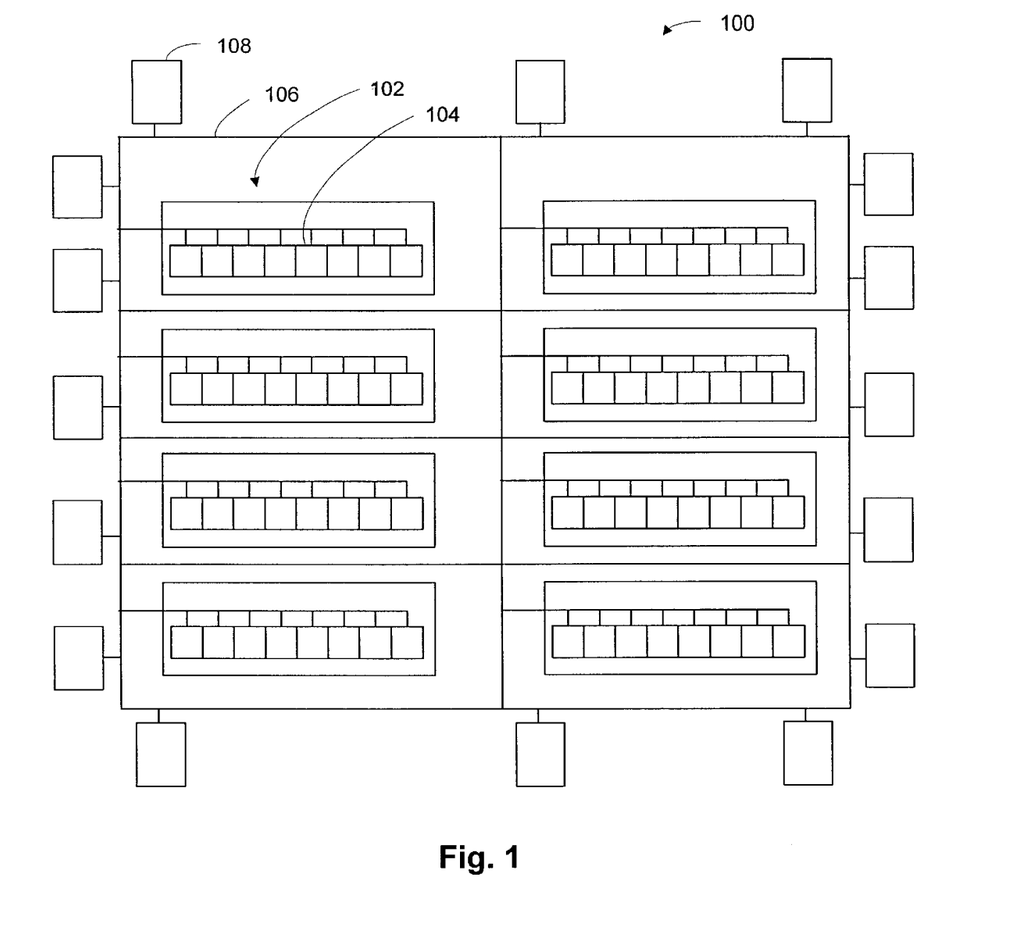
FIG. 1 is a simplified block diagram of an exemplary programmable logic device PLD)

With reference to FIG. 1, a simplified block diagram of an exemplary programmable logic device (PLD) 100 is depicted. PLD 100 includes a plurality of logic array blocks (LABs) 102, which are grouped sets of programmable logic resources. Each LAB 102 in turn includes a plurality of logic elements (LEs) 104 that can be configured or programmed to perform logical functions, such as AND, OR, NOT, XOR, NAND, NOR, and the like. It should be recognized that PLD 100 can include any number of programmable logic resources arranged in various configurations. Furthermore, PLD 100, LABs 102, and LEs 104 can be referred by various names or terms. For example, PLD 100 can be referred to as a PAL, PLA, FPLA, EPLD, CPLD, EEPLD, LCA, FPGA, and the like.

With continued reference to FIG. 1, PLD 100 includes interconnects 106 that connect LABs 102 and LEs 104. PLD 100 also includes I/Os 108 that are connected to interconnects 106 and provide access to LABs 102 and LEs 104. It should be recognized that PLD 100 can include any number of interconnects and I/Os in various configurations.

Figure 2:
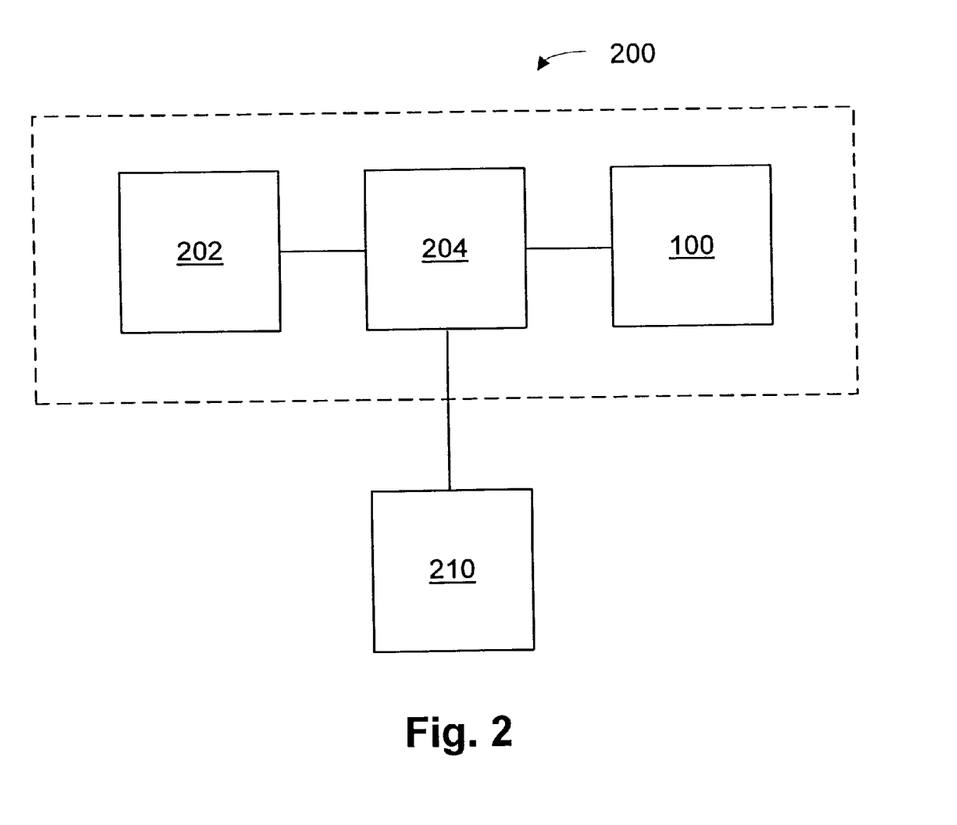
FIG. 2 is a block diagram of an exemplary system with a PLD component.

With reference to FIG. 2, PLD 100 is depicted as a component of a system 200, such as a PDA, a cell phone, and the like. As depicted in FIG. 2, system 200 can also includes a processor 202 and a memory 204 that are connected to PLD 100. It should be noted, however, that system 200 can include various components connected in various configurations.

As noted earlier, PLD 100 can be configured to perform various logical functions. Typically, when system 200 is powered down, the configuration of PLD 100 is cleared. As such, the configuration data used to configure PLD 100 is stored in a non-volatile memory 204, such as a EPROM, EEPROM, FLASH-EPROM, and the like. When system 200 is powered up, processor 202 can configure PLD 100 using the configuration data stored in memory 204.

With continued reference to FIG. 2, the configuration data can be initially loaded into memory 204 during the production of system 200 using a computer 210. It should be recognized, however, that computer 210 can also be used to change the configuration data in memory 204 post-production of system 200.

For the sake of clarity, in the following description, the process of loading the configuration data in memory 204 from computer 210 will be referred to as "programming", and the process of loading the configuration data onto PLD 100 from memory 204 will be referred to as "configuring." It should be recognized, however, that the distinction between programming and configuring is arbitrary and that these terms can be used interchangeably.

Figure 3:
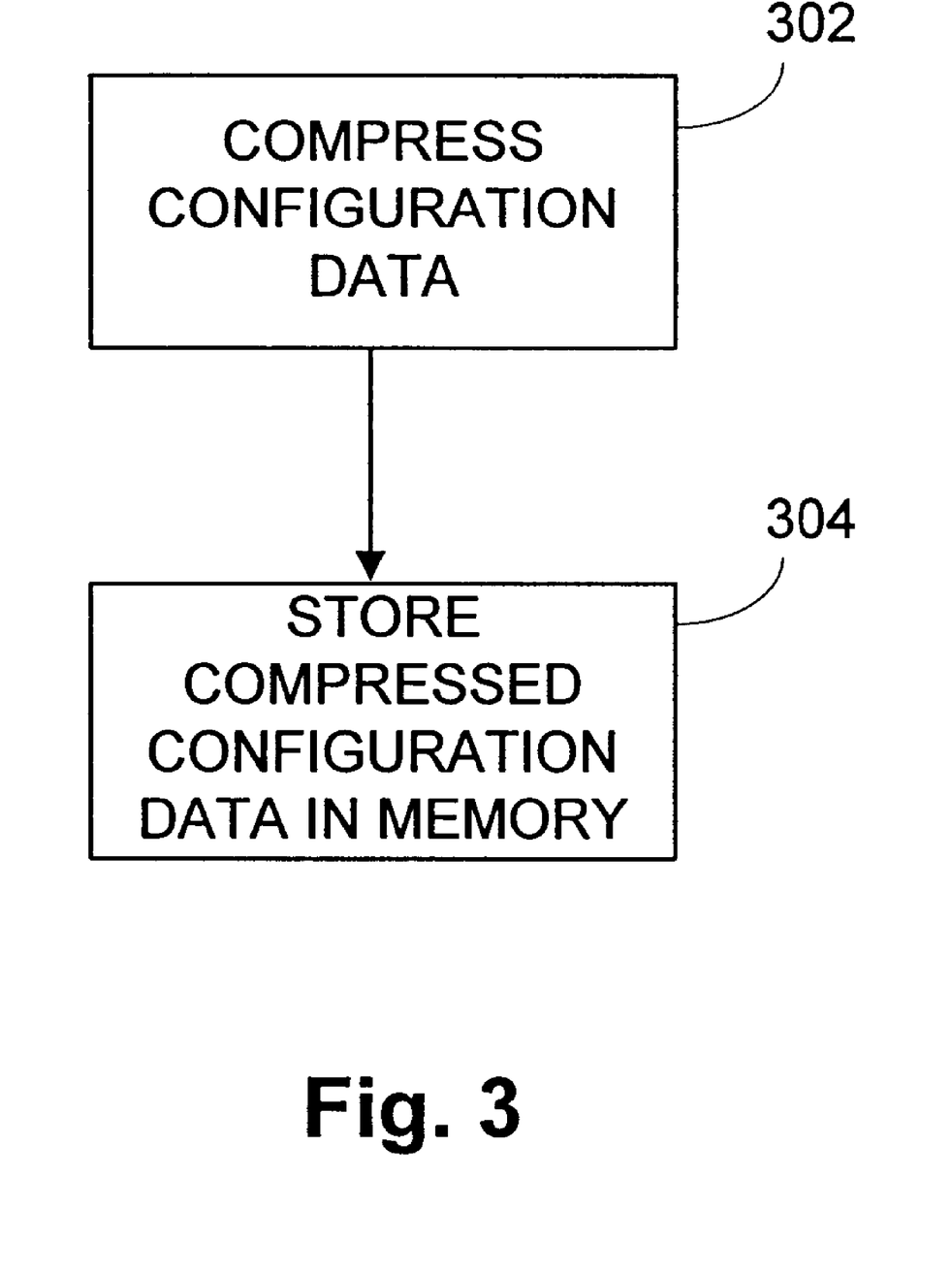
FIG. 3 is a flow chart of an exemplary process for programming a memory with the configuration data for a PLD.

In accordance with one aspect of the present invention, when memory 204 is to be programmed with the configuration data, the configuration data is compressed, then stored in memory 204. More particularly, with reference to FIG. 3, in step 302, the configuration data is compressed using a compression algorithm. In step 304, the compressed configuration data is stored in memory 204 (FIG. 2).

Figure 4:
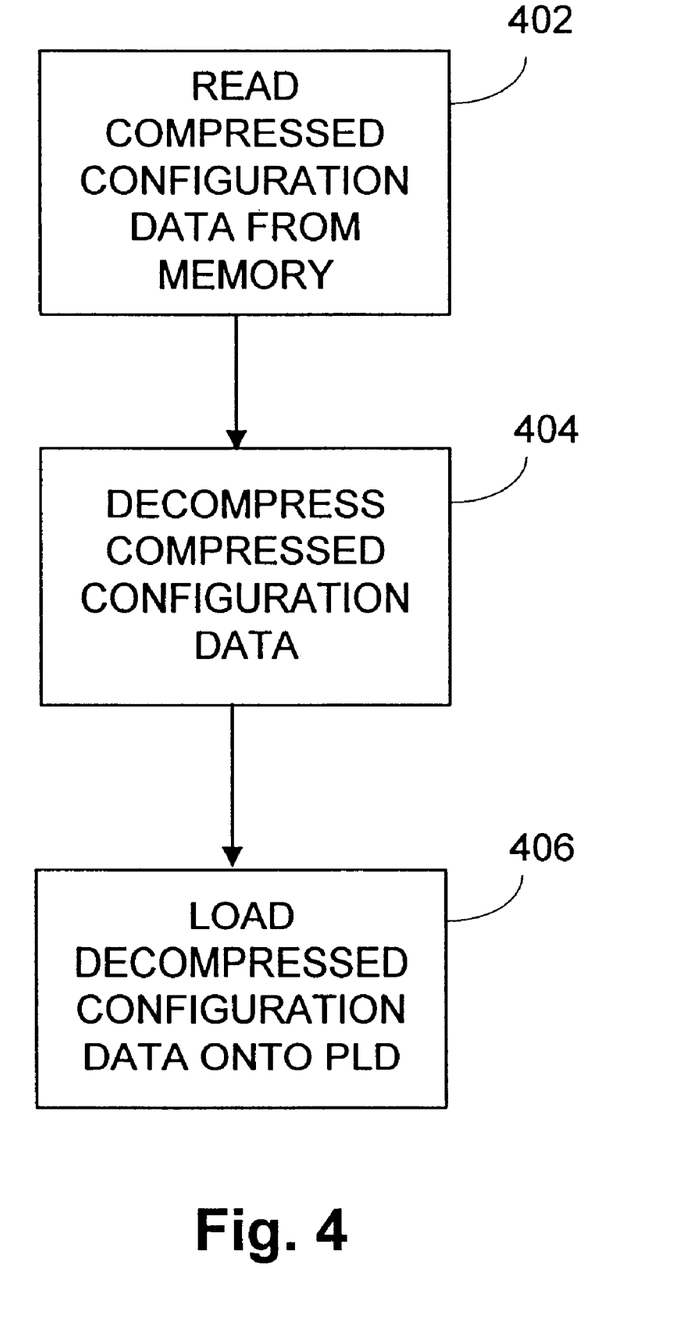
FIG. 4 is a flow chart of an exemplary process of configuration a PLD with the configuration data.

With reference again to FIG. 2, when PLD 100 is to be configured with the configuration data, the compressed configuration data is read from memory 204, decompressed, then loaded onto PLD 100. More particularly, with reference to FIG. 4, in step 402, the compressed configuration data is read from memory 204 (FIG. 2). In step 404, the compressed configuration data is decompressed. In step 406, the decompressed configuration data is loaded onto PLD 100 (FIG. 2).

With reference again to FIG. 2, by compressing the configuration data, the amount of data stored in memory 204 can be reduced. Thus, the amount of time required to write (program) the data into memory 204 can be reduced. Additionally, the amount of time required to read the configuration data from memory 204 can be reduced. Thus, the amount of time required to write (configure) the data onto PLD 100 can be reduced. This can be particularly advantageous when memory 204 is a slower memory device, which tends to be less expensive than a faster memory device.

As will be discussed in greater detail below, any convenient compression and decompression algorithm can be used depending on the application with different algorithms having different advantages and disadvantages. For example, different types of data exhibit different patterns, and each compression algorithm is best suited for a different kind of data (e.g., graphic images, English text, digitized audio, ARM program files, and the like). For an overview of compression algorithms, see "Data Compression and Compaction" in the Encyclopedia of Computer Science, 3rd ed., edited by Ralston and Reily, published by Van Nostrand Reinhold and printed by IEEE Press, the entire content of which is incorporated herein by reference.

Figure 5:
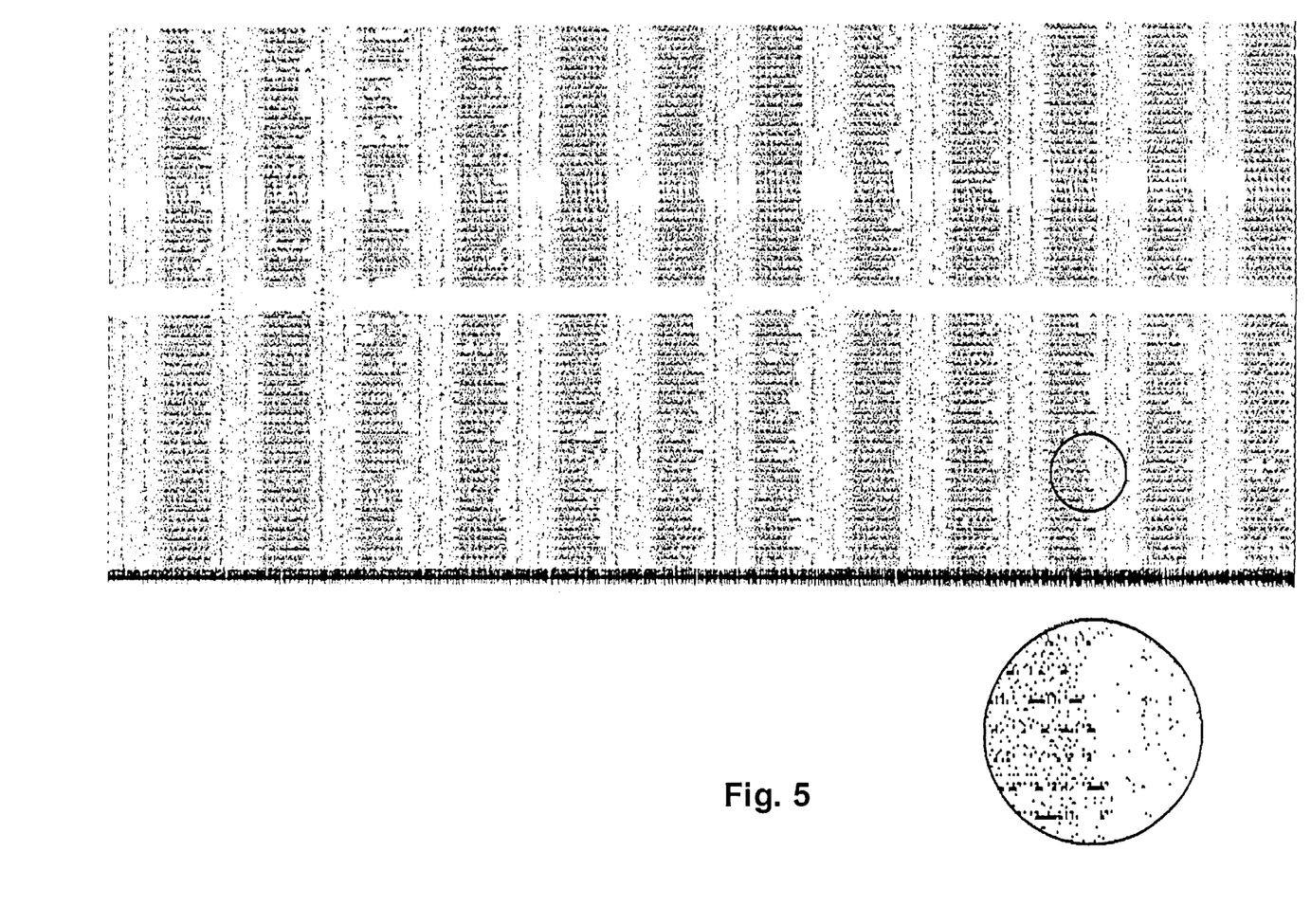
FIG. 5 is a representation of an exemplary configuration data for a PLD.

FIG. 5 is a bitmap representation, with black dots representing ones, of a configuration data of an exemplary PLD 100 (FIG. 1) manufactured by Altera Corporation of San Jose, Calif. In the representation of the configuration date depicted in FIG. 5, the serial stream of data starts in the upper-left corner and extends left-to-right and top-to-bottom. As can be noted from FIG. 5, the configuration data is mostly zeroes (about 90 percent) and the bits form patterns. These two-characteristics make the configuration data of PLD 100 (FIG. 1) particularly suited to compression by a compression algorithm that is efficient at compressing runs of zeroes.

As an additional consideration in selecting a suitable compression algorithm, a compression algorithm is paired with a corresponding decompression algorithm. Sometimes the compression algorithm is more complex than the decompression algorithm, and sometimes the decompression algorithm is more complex. In selecting between different compression and decompression pairings, it is advantageous to place greater emphasis on the speed and simplicity of the decompression algorithm than the speed and simplicity of the corresponding compression algorithm.

For example, in selecting between two compression and decompression pairings, assume that decompression algorithm for the first pairing is faster and/or simpler to implement than the decompression algorithm for the second pairing. Assume also that the corresponding compression algorithm for the first pairing is slower and/or more complex to implement than the corresponding compression algorithm for the second pairing. In this example, it is advantageous to select the first pairing because a more powerful processor can be used to run the compression algorithm than the decompression algorithm and the compression algorithm is likely to be used less frequently than the decompression algorithm.

More specifically, as noted earlier, with reference again to FIG. 2, the programming of memory 204 is typically performed by a computer 110, which is typically an engineering workstation. However, the configuration of PLD 100 is typically controlled by processor 202, which is generally less powerful and slower than computer 110. Additionally, as also noted earlier, the programming of memory 204 typically occurs when system 200 is manufactured or re-programmed. However, PLD 100 is typically configured each time system 200 is powered up.

1. Run Length Encoding (RLE)

One exemplary compression algorithm that can be used to compress the configuration data for PLD 100 is a Run Length Encoding (RLE) algorithm. In brief, RLE algorithms compress runs of consecutive zeroes or ones by replacing them with alternate codes. Because the configuration data of PLD 100 typically is predominately zeroes, the RLE algorithm in the present context can be used to compress runs of zeroes. RLE algorithms also convert between variable-length expanded data and fixed-length compression data.

The two tables below provide compressed and expanded data pairings of two exemplary RLE algorithms, which are labeled as RLE2 and RLE3:

| Compressed Data | Expanded Data |
|---|---|
| RLE2 Compression | |
| 00 | 1 |
| 01 | 0 |
| 10 | 00 |
| 11 | 000 |
| RLE3 Compression | |
| 000 | 1 |
| 001 | 0 |
| 010 | 00 |
| 011 | 000 |
| 100 | 0000 |
| 101 | 00000 |
| 110 | 000000 |
| 111 | 0000000 |

To decompress the configuration data that has been compressed using an RLE compression algorithm, a decompressor can be configured to read fixed-length data packets (2 or 3 bits in the examples provided above) and convert them into a variable number of zeros or ones. More particularly, in converting serial data, a down counter can be used to generate serially runs of zeros. Converting parallel data, however, can be more complicated and can require a barrel-shifting operation to align the variable-length output packets.

2. Huffman Encoding

Another exemplary compression algorithm that can be used to compress the configuration data for PLD 100 is a Huffman Encoding algorithm. In brief, Huffman Encoding algorithms compress data by representing the most common bit patterns with the shortest codes. Huffman Encoding algorithms also use unchanging dictionaries or conversion tables, and each data set that is compressed has its own dictionary, which is typically stored.

In contrast, RLE algorithms use the same dictionary for all of the data set. Encoding algorithms convert between fixed-length expanded data and variable-length compressed data. As noted earlier, RLE algorithms convert between variable-length expanded data and fixed-length compression data.

The table below provides compressed and expanded data paintings for an exemplary Huffman Encoding algorithm:

| Huffman Compression (9 of 686 lines shown) | |
|---|---|
| Compressed Data | Expanded Data |
| 1 | 0000000000000 |
| 01011 | 1100000000000 |
| 01001 | 0000000000010 |
| 01000 | 1000000000000 |
| 011111 | 0011000000000 |
| 011011 | 0000000001000 |
| 011001 | 0000000100000 |
| . | . |
| . | . |
| . | . |
| 0001110000101100 | 0000000101001 |
| 0001110000101101 | 0000000011011 |

To decompress the configuration data that has been compressed using a Huffman Encoding algorithm, a decompressor can be configured to read variable-length data packets (1 to 16 bits in the example provided above) and convert them into fixed-length packets (13 bits in the example provided above). As with RLE algorithms, a decompressor for serial data can be more straightforward than for parallel data. More particularly, for serial data, the decompressor can run the compressed data through a binary-tree style state machine, then write out fixed-length data packets as directed by the conversion table. However for similar reasons as in RLE decompression, the conversion of parallel data can be more difficult and require a more complicated decompressor. For example, for parallel data, the decompressor may require a barrel shifter to align the input data packets and a memory to store the dictionary.

3. Presence Bits

Yet another exemplary compression algorithm that can be used to compress the configuration data for PLD 100 is a Presence Bits algorithm. In brief, Presence Bits algorithms compress data by dividing the data into consecutive fields n bits long. Each bit of the presence bits corresponds to a field. In one example of a Presence Bits algorithm in which fields containing all zeros are omitted, if a field contains all zeros, then the bit corresponding to that field in the presence bits is set as a zero and the content of the field is not stored. If the content of a field does not contain all zeroes, then the bit corresponding to that field in the presence bits is set as a one and the content of the field is stored.

The table below provides compressed and expanded data pairings for an exemplary Presence Bits algorithm applied to four exemplary 12-bit data packets:

| Compressed Data | Expanded Data |
|---|---|
| 1001 | 1100 |
| 1100 | 0000 |
| 0001 | 0000 |
|  | 0001 |
| 0000 | 0000 |
|  | 0000 |
|  | 0000 |
|  | 0000 |

-continued

| Compressed Data | Expanded Data |
|---|---|
| 0010 | 0000 |
| 0001 | 0000 |
|  | 0001 |
|  | 0000 |
| 1111 | 0010 |
| 0010 | 0001 |
| 0001 | 0100 |
| 0100 | 1000 |
| 1000 |  |

In the above examples, the 12-bit data packets are divided into 4 fields with each filed being 4-bits long. As such, a 4-bit sized presence bits is used with each bit of the presence bits associated with each of the 4 fields. In this example, if a field contains all zeroes, then the bit in the presence bits associated with that field is set to zero and the content of the field is not stored. If a field does not contain all zeroes, then the bit in the presence bits associated with that field is set to one and the content of the field is stored.

For example, in the first 12-bit data package in the table above, the first field contains "100". Thus, the first bit of the presence bits is set to one and the content of the field (i.e., "1100") is stored following the presence bits. The second and third fields contain all zeros. Thus, the second and third bits of the presence bits are set to zeros and the contents of the fields are not stored. Finally, the fourth field contains "0001." Thus, the fourth bit of the presence bits is set to one and the content of the field (i.e., "0001") is stored following the presence bits. As such, in this example, the presence bits (i.e., "1001") and the contents of the first and fourth fields (i.e., "1100" and "0001") are stored.

In the second 12-bit data package, all of the fields are zeros. Thus, all of the bits in the presence bits are zeros and no fields are stored. As such, the 12-bit data package is stored as just the 4-bit presence bits. Thus, a Presence Bits algorithm is highly efficient when the data can be broken into a large number of fields having all zeroes.

In the third 12-bit data package, all but the third field contains all zeros. As such, the first, second, and fourth bits of the presence bits are set to zeros. The third bit of the presence bits is set to one, and the content of the third field is stored after the presence bits.

In the fourth 12-bit data package, none of the fields contain all zeros. As such, each of the bits of the presence bits is set to one, and the contents of all of the fields are stored after the presence bits. In this case, the presence bits algorithm can be expansive (i.e., the 12-bit data package is replaced by a 16-bit data package).

However, with reference again to FIG. 5 and as noted earlier, the typical configuration data for PLD 100 (FIG. 1) contains mostly zeroes. Moreover, if the configuration data is divided into consecutive fields n bits long, many of these fields are also zeroes. Thus, the configuration data of PLD 100 (FIG. 1) is particularly well suited for compression by using a Presence Bits algorithm to omit the all-zero fields.

To decompress the configuration data that has been compressed using a Presence Bits algorithm, a decompressor can be configured to read the presence bits ("1001" in the example provided above) and use the bits of the presence bits to indicate whether to send an all-zero output or to read the next field from memory and send it instead. In the example provided above, after reading the first bit of the presence bits (i.e., a one bit), the decompressor reads and outputs the next stored field (i.e., "1100"). After reading the next two bits of the presence bits (i.e., two zero: bits), the decompressor outputs two fields of zeros. After reading the fourth bit of the presence bits (i.e., a one bit), the decompressor reads and outputs the next stored field (i.e., "0001"). In comparison to the RLE and Huffrnan Encoding algorithms, the Presence Bits algorithm can be the simplest to implement.

Figure 6:
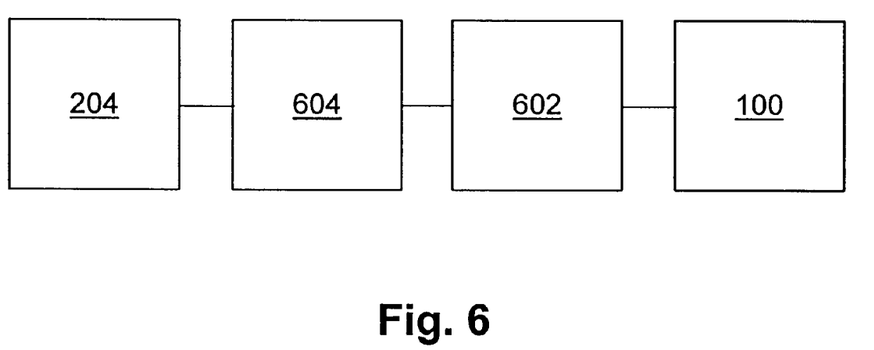
FIG. 6 is a block diagram of an exemplary system for decompressing the configuration data.

With reference to FIG. 6, in one exemplary embodiment, a decompressor 602 is connected to memory 204 and PLD 100. Additionally, in the present exemplary embodiment, a FIFO 604 is connected to memory 204 and decompressor 602. As such, in the present embodiment, the compressed configuration data is read from memory 204 into FIFO 604, decompressed by decompressor 602, then loaded into PLD 100. It should be recognized that the configuration data can be read, decompressed, and loaded using various circuitry.

Figure 7:
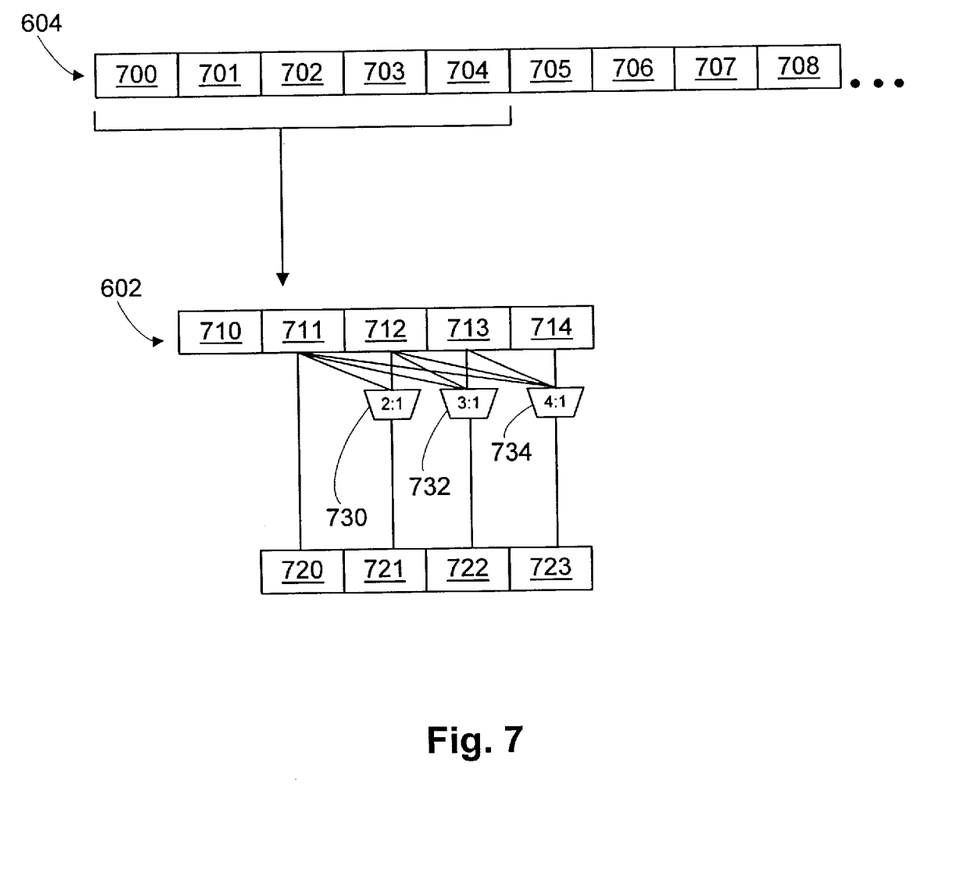
FIG. 7 is a block diagram of a portion of the system depicted in FIG. 6.

With reference to FIG. 7, the content of FIFO 604 is depicted being divided into a plurality of FIFO fields (i.e., FIFO fields 700 to 708). As depicted in FIG. 7, in the present embodiment, 5 FIFO fields at a time are loaded from FIFO 604 into 5 decompressor fields (i.e., decompressor fields 710 to 714) in decompressor 602. After decompressing the contents of decompressor fields 710 to 714, decompressor 602 outputs the result in output fields 720 to 723.

More particularly, assume for the sake of example, that each segment contains 4 bits. It should be recognized, however, that each segment can contain any number of bits. Now assume that the contents of FIFO fields 700 to 708 are as follows:

| Fields | Content |
| --- | --- |
| 700 | 0100 (Presence Bits) |
| 701 | 0011 |
| 702 | 1111 (Presence Bits) |
| 703 | 0010 |
| 704 | 1100 |
| 705 | 0001 |
| 706 | 1111 |
| 707 | 1000 (Presence Bits) |
| 708 | 0011 |

As noted earlier, in the present embodiment, 5 FIFO fields are loaded at a time from FIFO 6045 into decompressor 602. As such, in the present example, FIFO fields 700 to 704 are loaded into decompressor fields 710 to 714 in decompressor 602.

In the present embodiment, the content of decompressor field 710 is presumed to be the presence bits. In this example, the content of decompressor field 710 is "0100." As such, decompressor 602 places all zeros into output fields 720, 722, and 723. Decompressor 602 places the contents of 711 (i.e., 0011) into output field 721. Thus, decompressor 602 outputs a 16-bits package containing "0000001100000000."

As only one FIFO field contained data contained data (i.e., FIFO field 701), the pointer in FIFO 604 advances now to FIFO field 702. The next 5 FIFO fields are then loaded into decompressor 602. As such, the content of decompressor field 710 is now "1111." Thus, the contents of decompressor fields 711 to 714 are loaded into output fields 720 to 723, respectively. Thus, decompressor 602 outputs a 16-bit package containing "0010110000011111."

As depicted in FIG. 7, muxes 730, 732, and 734 can be used to load contents of decompressor fields 711 to 714 into output fields 720 to 723. More particularly, in the present embodiment, mux 730 is a 2:1 mux, mux 732 is a 3:1 mux, and mux 734 is a 4:1 mux. It should be recognized, however, that any convenient circuitry can be used.

Figure 8:
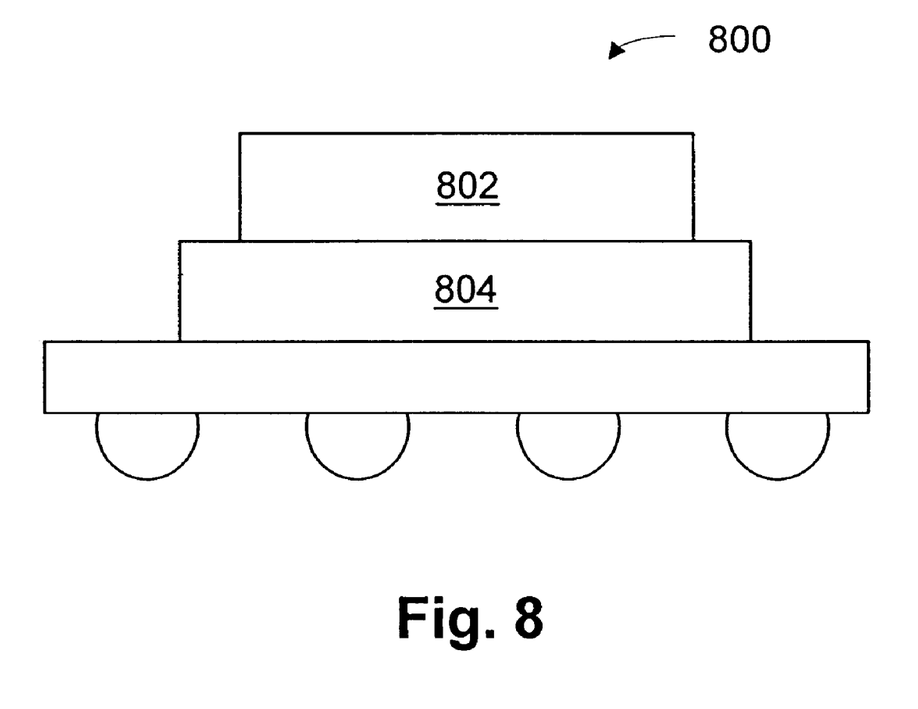
FIG. 8 is side view of a stacked-chip package.

With reference to FIG. 8, in one preferred embodiment, decompressor 602 (FIG. 6) and FIFO 604 (FIG. 6) can be implemented on an ASIC controller 802 and a FLASH memory 804, respectively. More particularly, as depicted in FIG. 8, ASIC controller 802 and FLASH memory 804 can be configured in a stacked-CSP package 800, which is available from Altera Corporation of San Jose, Calif.

With reference again to FIG. 6, it should be recognized that decompressor 602 and/or FIFO 604 can be implemented in any convenient manner. For example, decompressor 602 and/or FIFO 604 can be implemented as a component of system 200 (FIG. 2), such as on processor 202 (FIG. 2). Additionally, decompressor 602 and/or FIFO 604 can be implemented as components of PLD 100. For example, the programmable logic resources of PLD 100 can be configured to perform the functions of decompressor 602. The programmable logic resources of PLD 100 can also be used to store the configuration data. Alternatively, memory devices can be integrated into PLD 100.

Although the present invention has been described in conjunction with particular embodiments illustrated in the appended drawing figures, various modifications can be made without departing from the spirit and scope of the invention. Therefore, the present invention should not be construed as limited to the specific forms shown in the drawings and described above.

We claim:

1. A method of configuration a programmable logic device (PLD) comprising:

reading configuration data stored on a memory, wherein the configuration data was compressed using a compression algorithm before being stored on the memory;

transferring the compressed configuration data stored on the memory into a FIFO, wherein the FIFO holds portions of the compressed configuration data stored on the memory at a time;

decompressing the compressed configuration data transferred into the FIFO; and loading the decompressed configuration data onto the PLD.

2. The method of claim 1, wherein the compression algorithm is a Presence Bits algorithm.

3. The method of claim 2, wherein the configuration data is divided into discrete fields, and wherein tranferring the compressed configuration data includes transferring a plurality of the fields stored in the memory into the FIFO.

4. The method of claim 3, wherein decompressing the compressed configuration data includes:

transferring a set of fields from the FIFO into a decompressor, wherein the first field of the set of fields contains the presence bits;

reading the presence bits;

outputting an all zero output if the presence bit is a zero; and reading and outputting the next field transferred from the FIFO if the presence bit is a non-zero.

5. The method of claim 4, wherein the set of fields transferred from the FIFO includes 5 fields.

6. The method of claim 4, wherein the decompressor is implemented on an ASIC controller.

7. The method of claim 3, wherein each discrete field includes 4-bits.

8. The method of claim 1, wherein the non-volatile memory is a FLASH memory.

9. A method of configuration a programmable logic device (PLD) comprising:
- compressing configuration data for the PLD;
- storing the compressed configuration data on a memory;
- reading the compressed configuration data from the memory;
- transferring the compressed configuration data from the memory to a FIFO;
- decompressing the compressed configuration data transferred to the FIFO; and
- loading the decompressed configuration data onto the PLD.

10. The method of claim 9, wherein the configuration data is divided into discrete fields, and wherein decompressing the compressed configuration data includes:
- transferring a set of fields into a decompressor, wherein the first field of the set of fields contains the presence bits;
- reading the presence bits; and
- determining from the presence bits whether to output the next field transferred into the decompressor.

11. The method of claim 10, wherein the decompressor is implemented on an ASIC controller.

12. The method of claim 11, wherein the non-volatile memory is a FLASH memory.

13. The method of claim 12, wherein the ASIC controller and the FLASH memory are packaged as a stacked chip package.

14. The method of claim 9, where the configuration data is compressed using a Presence Bits algorithm.

15. A system for configuration a programmable logic device (PLD) comprising:
- a memory configured to store configuration data for the PLD, wherein the configuration data is compressed before being stored on the memory;
- a FIFO configured to receive portions of the compressed configuration data stored in the memory; and
- a decompressor configured to decompress the compressed configuration data from the FIFO, and to load the decompressed configuration data on the PLD.

16. The system of claim 15, wherein the memory is a FLASH memory.

17. The system of claim 16, wherein the decompressor is implemented on an ASIC controller.

18. The system of claim 17, wherein the FLASH memory and ASIC controller are packaged as a stacked chip package.

19. The system of claim 15, wherein the configuration data is compressed using a Presence Bits algorithm.

* * * * *